（12) United States Patent
Ali

(10) Patent No.: US 9,755,629 B2
(45) Date of Patent: Sep. 5, 2017

(54) CURRENT-CONTROLLED ACTIVE DIODE

(71) Applicant: Dialog Semiconductor (UK) Limited, London (GB)

(72) Inventor: Shafqat Ali, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/042,614

(22) Filed: Feb. 12, 2016

(65) Prior Publication Data

US 2016/0241225 A1    Aug. 18, 2016

(30) Foreign Application Priority Data

Feb. 13, 2015 (DE) .................. 10 2015 001 705

(51) Int. Cl.
*H03K 3/00* (2006.01)
*H03K 17/06* (2006.01)
*H03K 17/30* (2006.01)
*H03K 17/687* (2006.01)

(52) U.S. Cl.
CPC ......... *H03K 17/063* (2013.01); *H03K 17/302* (2013.01); *H03K 17/687* (2013.01)

(58) Field of Classification Search
USPC ........................................................ 327/109
See application file for complete search history.

(56) References Cited

U.S. PATENT DOCUMENTS 8,134,847 B2 * 3/2012 Trattler ............... H02M 3/1588
363/21.14

FOREIGN PATENT DOCUMENTS

WO    WO 2007 017057    2/2007

OTHER PUBLICATIONS

German Office Action 10 2015 001 705.5, dated Oct. 19, 2015, Dialog Semiconductor (UK) Limited.

* cited by examiner

*Primary Examiner* — Lincoln Donovan
*Assistant Examiner* — Patrick Chen
(74) *Attorney, Agent, or Firm* — Saile Ackerman LLC; Stephen B. Ackerman

(57) ABSTRACT

This application relates to an active diode circuit for letting current pass in one direction and blocking current in the opposite direction. The active diode circuit comprises a transistor, a control voltage generation circuit for generating a control voltage that is supplied to a control terminal of the transistor, and a sensing circuit for detecting a quantity indicative of a current flowing through the transistor. The control voltage generation circuit generates the control voltage in dependence on the detected quantity. The application further relates to a method of controlling a transistor to function as an active diode so that current may pass in one direction and is blocked in the opposite direction.

22 Claims, 5 Drawing Sheets

CURRENT-CONTROLLED ACTIVE DIODE

TECHNICAL FIELD

This application relates to active diode circuits and to methods of controlling a transistor to function as an active diode. The application particularly relates to current-controlled active diode circuits and methods of controlling a transistor to function as an active diode involving current control.

BACKGROUND

Active diodes are used to replace (passive) diodes e.g. in applications in which a threshold voltage (cut-in voltage) in the forward direction of the diode is undesirable, such as in charging systems of mobile devices, for example. An example of a conventional active diode is shown in FIG. 5. This active diode 5 comprises a transistor 510 and a comparator 520, as well as appropriately chosen resistors 551, 553, if necessary. A control voltage depending on the polarity of a voltage drop across the transistor 510 is supplied to a control terminal of the transistor 510 by the comparator 520, wherein the control voltage is set to switch the transistor 510 fully on (fully conducting state) e.g. for positive voltage drop. However, the voltage drop across the transistor 510 becomes small once the transistor 510 is driven in the fully conducting state, which then may result in fluctuations of the control voltage that is output by the comparator 520, and consequently, in oscillations of the active diode 5. Measures to address this issue include employing low gain amplifiers instead of comparators to provide the control voltage for the transistor 510. This however results in less power efficient active diodes, since the low gain amplifiers require a larger voltage drop across the transistor 510 until the transistor 510 is switched fully on.

SUMMARY

There is a need for improved active diode schemes. In particular, there is a need for active diode schemes that avoid oscillation and are more power efficient. In view of this need, the present document proposes an active diode circuit and a method of controlling a transistor to function as an active diode having the features of the respective independent claims.

An aspect of the disclosure relates to an active diode circuit for letting current pass in one direction and substantially blocking current in the opposite direction. The active diode circuit may comprise a (first) transistor (e.g. a MOSFET, such as a PMOS or an NMOS, for example), a control voltage generation circuit for generating a control voltage that is supplied to a control terminal (e.g. a gate terminal) of the transistor, and a sensing circuit (e.g. a current sensing circuit) for detecting a quantity indicative of a current flowing through the transistor. Said quantity may be indicative of a current flowing between a source terminal and a drain terminal of the transistor, and may be e.g. the current itself, or a voltage derived from the current. The control voltage generation circuit may be configured to generate the control voltage in dependence on the detected quantity. In other words, the transistor may be controlled (switched) in accordance with the detected quantity. For instance, the transistor may be driven (biased, or operated) in the fully conducting state if the detected quantity satisfies a predetermined condition for the detected quantity, e.g. exceeds a predetermined threshold.

Configured as above, the active diode circuit provides for switching of the transistor (e.g. to the fully conducting state) in accordance with the current flowing through the transistor, independently of the voltage drop across the transistor becoming small when the transistor is in the fully conducting state. Accordingly, when the transistor enters the fully conducting state, oscillations of the active diode circuit as experienced in the prior art are effectively avoided, and a stable active diode circuit is provided. Moreover, low power dissipation of the active diode circuit is achieved even when employing small gain amplifiers in the process of generating the control voltage, since the switching of the transistor is performed in dependence on the current flowing through the transistor, i.e. under current control. For the same reason, current-voltage characteristics very close to those of a passive diode can be realized, however without suffering from a forward direction threshold voltage and respective losses in the diode.

The above aspect also encompasses an implementation in which oscillations of the voltage drop may be detected, and the transistor may be switched to the fully conducting state in reaction to said detection. The transistor may then be stopped to be driven in the fully conducting state in accordance with the detected quantity (e.g. if the detected quantity drops below a given lower threshold).

In embodiments, the control voltage generation circuit may be configured to generate the control voltage further in accordance with a detected voltage drop (voltage difference) across the transistor. In other words, the transistor may be controlled in accordance with the detected quantity and the voltage drop. The voltage drop may be detected e.g. as a voltage drop between the source terminal and the drain terminal of the transistor. The control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies a first condition (e.g. indicating a correct direction (polarity) of the voltage drop), and further, that the transistor is driven (biased, or operated) in the fully conducting state if, regardless of the voltage drop, the detected quantity satisfies a second condition (e.g. the predetermined condition for the detected quantity). Conversely, if the voltage drop does not satisfy the first condition and the detected quantity does not satisfy the second condition, current may be (substantially) blocked from passing through the transistor.

In other words, the transistor may be driven in accordance with the voltage drop for the first condition being satisfied, in the fully conducting state for the second condition being satisfied, regardless of whether or not the first condition is still satisfied, and in the non-conducting state (i.e. in the cut-off region) for neither of the first or second conditions being satisfied. The first condition may be a condition on a polarity of the detected voltage drop, such as whether the polarity of the detected voltage drop is equal to a given polarity, for example. The first condition may further relate to whether the detected voltage drop is above a threshold for the voltage drop, e.g. above a voltage enabling a current to flow across the transistor (i.e. above a threshold voltage of the transistor). The second condition may be a condition on a magnitude on the detected quantity, such as whether the detected quantity (e.g. current) exceeds a predetermined threshold.

Accordingly, a two-stage switching procedure may be implemented by the active diode circuit. Initially, the transistor is switched to enable current flow for a voltage drop in a desired forward direction of the active diode circuit, i.e. the transistor is switched in accordance with the voltage drop. Then, for increasing currents flowing though the transistor, the transistor is switched fully on (i.e. to the fully conducting state), disregarding the voltage drop. Since the second stage of this two-stage switching procedure is performed under current control, oscillations of the active diode circuit do not occur, as indicated above.

In the present disclosure, the fully conducting state of the transistor is understood as a state in which a substantial amount of current may pass through the transistor and which is sufficiently removed from the cut-off region. The fully conducting state may relate to the linear region (triode region, or ohmic mode) of the transistor, or to the saturation region (active mode) of the transistor.

In embodiments, the control voltage generation circuit may be further configured to compare the detected quantity to a predetermined threshold. The control voltage generation circuit may be yet further configured to output, as the control voltage, a first voltage that is sufficient to drive the transistor in the fully conducting state if the detected quantity exceeds the predetermined threshold. That is, the first voltage may be sufficient to drive the transistor in the linear region (ohmic mode) or in the saturation region (in active mode).

In this configuration, the current-voltage characteristics of the active diode circuit can be adapted to specific needs by appropriate choice of the predetermined threshold and optionally of the amplifier gain.

In embodiments, the control voltage generation circuit may be further configured to output, as the control voltage, a second voltage that is given by a function (e.g. a linear function) of the voltage drop if the detected quantity does not exceed the predetermined threshold. Here, the second voltage may be an amplified version of the detected voltage drop. Contrary to the first voltage, depending on the voltage drop the second voltage may be insufficient to drive the transistor in the linear region or the saturation region (unless the second condition is met and the control voltage is further increased).

Accordingly, erroneous or premature switching of the transistor to the fully conducting state is avoided, and a stable active diode circuit can be provided. Moreover, reliable blocking of the current in the reverse direction is achieved, even in the presence of offsets of amplifiers or comparators involved in generating the control voltage.

In embodiments, the control voltage generation circuit may comprise a comparator configured to output a voltage signal (e.g. a multi-level voltage signal, such as a binary voltage signal, for example) in accordance with a result of the comparison of the detected quantity to the predetermined threshold. The control voltage generation circuit may further comprise a (first) controllable switching element configured to switch in accordance with the (e.g. binary) voltage signal. The controllable switching element may be connected between a supply voltage and an output terminal of the control voltage generation circuit (e.g. between a supply voltage and the control terminal of the transistor). Said controllable switching element may be a transistor, e.g. a MOSFET, such as a PMOS or an NMOS, for example. The supply voltage may be sufficient to drive the transistor in the fully conducting state (e.g. in the linear region or saturation region). The control voltage generation circuit may further comprise an amplifier configured to amplify the detected voltage drop. The control voltage generation circuit may further comprise a second controllable switching element connected between an output terminal of the amplifier and an intermediate node between the controllable switching element and the output terminal of the control voltage generation circuit. The second controllable switching element may be configured to switch in accordance with the (e.g. binary) voltage signal in antiphase to the controllable switching element. That is, the second controllable switching element may be controlled to be in the conducting state if the (first) controllable switching element is controlled to be in the non-conducting state, and vice versa.

Configured as above, the supply voltage is supplied to the control terminal of the transistor as the control voltage so as to switch the transistor to the fully conducting state if the detected quantity exceeds the predetermined threshold, and otherwise the control voltage is generated by the amplifier in accordance with the voltage drop across the transistor. Thereby, the above-described two-stage switching of the transistor is implemented in a simple and efficient manner.

In embodiments, the control voltage generation circuit may comprise a comparator configured to output a voltage signal (e.g. a multi-level voltage signal, such as a binary voltage signal, for example) in accordance with a result of the comparison of the detected quantity to the predetermined threshold. The control voltage generation circuit may further comprise a (first) controllable switching element configured to switch in accordance with the (e.g. binary) voltage signal. The controllable switching element may be connected between a supply voltage and an output terminal of the control voltage generation circuit (e.g. between the supply voltage and the control terminal of the transistor). Said controllable switching element may be a transistor, e.g. a MOSFET, such as a PMOS or an NMOS, for example. The supply voltage may be sufficient to drive the transistor in the fully conducting state (e.g. in the linear region or saturation region). The control voltage generation circuit may further comprise a second transistor connected between the supply voltage and the output terminal of the control voltage generation circuit. The control voltage generation circuit may further comprise an amplifier configured to amplify the detected voltage drop. The detected voltage drop may be applied to positive and negative input terminals of the amplifier, e.g. one of the positive and negative input terminals of the amplifier may be connected to a source-terminal-side of the transistor, and the other one of the positive and negative input terminals of the amplifier may be connected to a drain-terminal-side of the transistor. An output of the amplifier may be supplied to a control terminal of the second transistor.

Configured as above, the supply voltage is supplied to the control terminal of the transistor as the control voltage so as to switch the transistor to the fully conducting state if the detected quantity exceeds the predetermined threshold, and otherwise the control voltage is generated by the amplifier in accordance with the voltage drop across the transistor (e.g. as a function, such as a linear function, of the voltage drop). Thereby, the above-described two-stage switching of the transistor is implemented in a simple and efficient manner.

In embodiments, the control voltage generation circuit may further comprise a switchable current source (switchable current sink) connected between the output terminal of the control voltage generation circuit and ground (e.g. between the second transistor and ground). The switchable current source may be configured to switch in accordance with the (e.g. binary) voltage signal in antiphase to the (first) controllable switching element. The switchable current sink may be implemented by a series connection of a current sink and a second controllable switching element, which is connected between the output terminal of the control voltage generation circuit and ground (e.g. between the second transistor and ground). The second controllable switching element may be configured to switch in accordance with the (e.g. binary) voltage signal in antiphase to the (first) controllable switching element.

Configured as above, a current is pulled from the second transistor towards ground and appropriate control of the (first) transistor is ensured for small initial voltage drop across the (first) transistor.

Another aspect of the disclosure relates to an active diode circuit for letting current pass in one direction and (substantially) blocking current in the opposite direction. The active diode circuit may comprise a transistor (e.g. a MOSFET, such as a PMOS or an NMOS, for example) and a control voltage generation circuit for generating a control voltage that is supplied to a control terminal (e.g. a gate terminal) of the transistor. The active diode circuit may further comprise a voltage sensing circuit for detecting a voltage drop (voltage difference) across the transistor and an oscillation sensing circuit for detecting an oscillation of the detected voltage drop. The voltage drop may be detected e.g. as a voltage drop (voltage difference) between a source terminal and a drain terminal of the transistor. The control voltage generation circuit may be configured to generate the control voltage in dependence on the detected voltage drop and a detection result of the oscillation sensing circuit. In other words, the transistor may be controlled (switched) in accordance with the detected voltage drop and the detection result of the oscillation sensing circuit.

In embodiments, the control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies a first condition (e.g. indicating a correct direction (polarity) of the voltage drop), and the transistor is driven in the fully conducting state if oscillation of the voltage drop is detected, e.g. regardless of a size of the voltage drop. Conversely, if the voltage drop does not satisfy the first condition and oscillation of the voltage drop is not detected, current may be (substantially) blocked from passing through the transistor.

In other words, the transistor may be driven in accordance with the voltage drop for the first condition being satisfied, in the fully conducting state for oscillation of the voltage drop having been detected, regardless of whether or not the first condition is still satisfied, and in the non-conducting state (i.e. in the cut-off region) if the first condition is not satisfied and, at the same time, oscillation of the voltage drop is not detected. The first condition may be a condition on a polarity of the detected voltage drop, such as whether the polarity of the detected voltage drop is equal to a given polarity, for example. The first condition may further relate to whether the detected voltage drop is above a threshold for the voltage drop, e.g. above a voltage enabling a current to flow across the transistor (i.e. above a threshold voltage of the transistor). Oscillation of the voltage drop may be considered detected e.g. if a number of fluctuations of the voltage drop per unit time exceeds a predetermined threshold value for this number, counting only those fluctuations that are larger than a predetermined threshold for the fluctuations. As the skilled person will appreciate, also alternative procedures for detecting oscillation of the voltage drop may be employed.

Accordingly, a two-stage switching procedure may be implemented by the active diode circuit. Initially, the transistor is switched to enable current flow for a voltage drop in a desired forward direction of the active diode circuit, i.e. the transistor is switched in accordance with the voltage drop. Then, for increasing currents flowing though the transistor, oscillation of the voltage drop may occur, which is detected, so that the transistor is switched fully on (i.e. to the fully conducting state), disregarding a size of the voltage drop. Accordingly, persistent oscillations of the active diode circuit are prevented.

In embodiments, the active diode circuit may further comprise a current sensing circuit for detecting a quantity indicative of a current flowing through the transistor. Said quantity may be indicative of a current flowing between the source terminal and the drain terminal of the transistor, and may be e.g. the current itself, or a voltage derived from the current. Then, the control voltage generation circuit may be further configured to compare the detected quantity to a predetermined threshold. The control voltage generation circuit may be yet further configured to stop driving the transistor in the fully conducting state if the detected quantity is below the predetermined threshold and the transistor is driven in the fully conducting state. At this point, switching of the transistor may be continued to be performed in accordance with the detected voltage drop. In other words, once driving the transistor in the fully conducting state is stopped, the control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies the first condition (e.g. indicating the correct direction (polarity) of the voltage drop).

The above aspect encompasses an implementation in which oscillations of the voltage drop may be detected, and the transistor may be switched to the fully conducting state in reaction to said detection. The transistor may then be stopped to be driven in the fully conducting state in accordance with the detected quantity (e.g. if the detected quantity drops below a given lower threshold).

Accordingly, oscillations of the active diode circuit as experienced in the prior art are effectively avoided, and a stable active diode circuit is provided. Moreover, low power dissipation of the active diode circuit is achieved even when employing small gain amplifiers in the process of generating the control voltage, since the switching of the transistor to fully conducting may be performed in dependence on whether oscillation of the voltage drop is detected, rather than in dependence on a size of the voltage drop.

Another aspect of the disclosure relates to a method of controlling a (first) transistor (e.g. a MOSFET, such as a PMOS or an NMOS, for example) to function as an active diode so that current may pass in one direction and is (substantially) blocked in the opposite direction. The method may comprise detecting a voltage drop (voltage difference) across the transistor and detecting a quantity indicative of a current flowing through the transistor. The voltage drop may be detected e.g. as a voltage drop between a source terminal and a drain terminal of the transistor. The detected quantity may be indicative of a current flowing between the source terminal and the drain terminal of the transistor, and may be e.g. the current itself, or a voltage derived from the current. The method may further comprise generating a control voltage that is supplied to a control terminal (e.g. gate terminal) of the transistor in dependence on the voltage drop and the detected quantity. In other words, the transistor may be controlled (switched) in accordance with the detected quantity and the voltage drop.

Therein, the control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies a first condition, and further, that the transistor is driven (biased, or operated) in the fully conducting state if, regardless of the voltage drop, the detected quantity satisfies a second condition. Conversely, if the voltage drop does not satisfy the first condition and the detected quantity does not satisfy the second condition, current may be (substantially) blocked from passing through the transistor. In other words, the transistor may be driven in accordance with the voltage drop for the first condition being satisfied, in the fully conducting state for the second condition being satisfied, regardless of whether or not the first condition is satisfied, and in the non-conducting state (i.e. in the cut-off region) for neither of the first or second conditions being satisfied. The first condition may be a condition on a polarity of the detected voltage drop, such as whether the polarity of the detected voltage drop is equal to a given polarity, for example. The first condition may further relate to whether the detected voltage drop is above a threshold for the voltage drop, e.g. above a voltage enabling a current to flow across the transistor (i.e. above a threshold voltage of the transistor). The second condition may be a condition on a magnitude on the detected quantity, such as whether the detected quantity exceeds a predetermined threshold.

In embodiments, the method may be a 2-step process where the first condition is tested to determine that the voltage drop across the transistor has the correct polarity (i.e. the active diode is operated in the forward direction). Once it has been verified that the first condition is met, the transistor is driven in accordance with the detected voltage drop and the second condition is tested to determine that the current flowing (in the right direction) through the transistor has a sufficient amount. Then the transistor is driven to the fully conducting state.

In embodiments, when it has been determined that the first condition is met, generating the control voltage may involve outputting, as the control voltage, a voltage that is given by a function (e.g. a linear function) of the voltage drop as long as the detected quantity does not exceed the predetermined threshold. Here, the voltage may be an amplified version of the detected voltage drop and, depending on the voltage drop, may be insufficient to drive the transistor in the linear region or the saturation region.

In embodiments, generating the control voltage may involve comparing the detected quantity to a predetermined threshold, and outputting, as the control voltage, a voltage that is sufficient to drive the transistor in the fully conducting state if the detected quantity exceeds the predetermined threshold. That is, the voltage may be sufficient to drive the transistor in the linear region (ohmic mode) or in the saturation region (in active mode).

In embodiments, the method may further comprise generating a voltage signal (e.g. a multi-level voltage signal, such as a binary voltage signal, for example) in accordance with a result of the comparison, and switching a (first) controllable switching element that is connected between a supply voltage and the control terminal of the transistor in accordance with the (e.g. binary) voltage signal. The controllable switching element may be a transistor, e.g. a MOSFET, such as a PMOS or an NMOS, for example. The supply voltage may be sufficient to drive the transistor in the fully conducting state (e.g. in the linear region or saturation region). The method may further comprise amplifying the detected voltage drop by means of an amplifier, and switching a second controllable switching element connected between an output terminal of the amplifier and an intermediate node between the (first) controllable switching element and the control terminal of the transistor in accordance with the (e.g. binary) voltage signal in antiphase to the (first) controllable switching element. That is, the second controllable switching element may be controlled to be in the conducting state if the (first) controllable switching element is controlled to be in the non-conducting state, and vice versa.

In embodiments, the method may further comprise generating a voltage signal (e.g. a multi-level voltage signal, such as a binary voltage signal, for example) in accordance with a result of the comparison, and switching a (first) controllable switching element that is connected between a supply voltage and the control terminal of the transistor in accordance with the (e.g. binary) voltage signal. The controllable switching element may be a transistor, e.g. a MOSFET, such as a PMOS or an NMOS, for example. The supply voltage may be sufficient to drive the transistor in the fully conducting state (e.g. in the linear region or saturation region). The method may further comprise amplifying the detected voltage drop, and applying the amplified voltage drop to a control terminal of a second transistor connected between the supply voltage and the control terminal of the transistor. The detected voltage drop may be applied to positive and negative input terminals of the amplifier, e.g. one of the positive and negative input terminals of the amplifier may be connected to a source-terminal-side of the transistor, and the other one of the positive and negative input terminals of the amplifier may be connected to a drain-terminal-side of the transistor.

In embodiments, the method may further comprise switching a switchable current source (switchable current sink) in accordance with the (e.g. binary) voltage signal in antiphase to the (first) controllable switching element. The switchable current source may be connected between the second transistor and ground. The switchable current sink may be implemented by a series connection of a current sink and a second controllable switching element, and the method may comprise switching the second controllable switching element in accordance with the (e.g. binary) voltage signal in antiphase to the (first) controllable switching element. Therein, the series connection may be connected between the second transistor and ground.

Another aspect of the disclosure relates to a method of controlling a transistor (e.g. a MOSFET, such as a PMOS or an NMOS, for example) to function as an active diode so that current may pass in one direction and is (substantially) blocked in the opposite direction. The method may comprise detecting a voltage drop (voltage difference) across the transistor. The voltage drop may be detected e.g. as a voltage drop (voltage difference) between a source terminal and a drain terminal of the transistor. The method may further comprise determining whether an oscillation of the detected voltage drop is present. The method may yet further comprise generating a control voltage that is supplied to a control terminal (e.g. a gate terminal) of the transistor in dependence on the voltage drop and a result of said determination. In other words, the transistor may be controlled (switched) in accordance with the voltage drop and the result of said determination. Therein, the control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies a first condition (e.g. indicating a correct direction (polarity) of the voltage drop), and the transistor is driven in the fully conducting state it is determined that oscillation of the voltage drop is present, e.g. regardless of a size of the voltage drop. Conversely, if the voltage drop does not satisfy the first condition and oscillation of the voltage drop is not detected, current may be (substantially) blocked from passing through the transistor.

In other words, the transistor may be driven in accordance with the voltage drop for the first condition being satisfied, in the fully conducting state for oscillation of the voltage drop having been detected, regardless of whether or not the first condition is still satisfied, and in the non-conducting state (i.e. in the cut-off region) if the first condition is not satisfied and, at the same time, oscillation of the voltage drop is not detected. The first condition may be a condition on a polarity of the detected voltage drop, such as whether the polarity of the detected voltage drop is equal to a given polarity, for example. The first condition may further relate to whether the detected voltage drop is above a threshold for the voltage drop, e.g. above a voltage enabling a current to flow across the transistor (i.e. above a threshold voltage of the transistor). Oscillation of the voltage drop may be considered detected e.g. if a number of fluctuations of the voltage drop per unit time exceeds a predetermined threshold value for this number, counting only those fluctuations that are larger than a predetermined threshold for the fluctuations. As the skilled person will appreciate, also alternative procedures for detecting oscillation of the voltage drop may be employed.

Accordingly, a two-stage switching procedure may be implemented. Initially, the transistor is switched to enable current flow for a voltage drop in a desired forward direction of the active diode circuit, i.e. the transistor is switched in accordance with the voltage drop. Then, for increasing currents flowing though the transistor, oscillation of the voltage drop may occur, which is detected, so that the transistor is switched fully on (i.e. to the fully conducting state), disregarding a size of the voltage drop. Accordingly, persistent oscillations of the active diode circuit are prevented.

In embodiments, when it has been determined that the first condition is met, generating the control voltage may involve outputting, as the control voltage, a voltage that is given by a function (e.g. a linear function) of the voltage drop as long as oscillation of the voltage drop is not detected. Here, the voltage may be an amplified version of the detected voltage drop and, depending on the voltage drop, may be insufficient to drive the transistor in the linear region or the saturation region.

In embodiments, generating the control voltage may involve outputting, as the control voltage, a voltage that is sufficient to drive the transistor in the fully conducting state if oscillation of the voltage drop is detected. That is, the voltage may be sufficient to drive the transistor in the linear region (ohmic mode) or in the saturation region (in active mode).

In embodiments, the method may further comprise detecting a quantity indicative of a current flowing through the transistor. The detected quantity may be indicative of a current flowing between the source terminal and the drain terminal of the transistor, and may be e.g. the current itself, or a voltage derived from the current. Then, generating the control voltage may involve comparing the detected quantity to a predetermined threshold. Generating the control voltage may further involve stopping driving the transistor in the fully conducting state, if the detected quantity is below the predetermined threshold and the transistor is driven in the fully conducting state. At this point, switching of the transistor may be continued to be performed in accordance with the detected voltage drop. In other words, once driving the transistor in the fully conducting state is stopped, the control voltage may be generated (e.g. in dependence on the detected voltage drop or as a function, such as a linear function, of the detected voltage drop) in such a manner, and correspondingly, the transistor may be controlled in such a manner, that the current may pass through the transistor if the voltage drop satisfies the first condition (e.g. indicating the correct direction (polarity) of the voltage drop).

It will be appreciated that method steps and apparatus features may be interchanged in many ways. In particular, the details of the disclosed apparatus can be implemented as a method, as the skilled person will appreciate.

BRIEF DESCRIPTION OF THE DRAWINGS

Embodiments of the disclosure are explained below in an exemplary manner with reference to the accompanying drawings, wherein FIG. 1 schematically illustrates an example of an active diode circuit according to embodiments of the disclosure, FIG. 2 schematically illustrates another example of an active diode circuit according to embodiments of the disclosure, FIG. 3 schematically illustrates a flow chart of an example of a method for controlling a transistor according to embodiments of the disclosure, FIG. 4 schematically illustrates current-voltage characteristics of an active diode circuit according to embodiments of the disclosure.

DESCRIPTION

Figure 1:
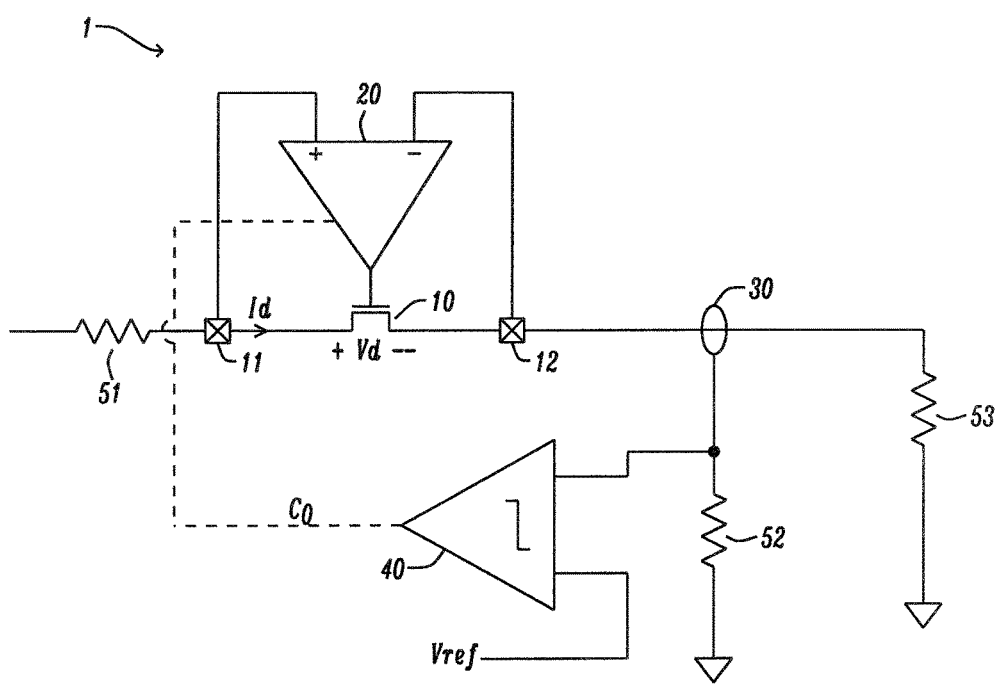

FIG. 1 schematically illustrates an example of an active diode circuit 1 according to embodiments of the disclosure. The active diode circuit 1 comprises a transistor (first transistor) 10 (e.g. a MOSFET, such as a PMOS or an NMOS, for example), a control voltage generation circuit 20, a sensing circuit (e.g. a current sensing circuit) 30, a comparator 40, as well as appropriately chosen resistors 51, 52, 53, if necessary. The comparator 40 may or may not be integrated with the control voltage generation circuit 20.

A voltage drop across the transistor 10 is detected and supplied to the control voltage generation circuit 20, e.g. by tapping voltages at nodes 11, 12 on either side of the transistor 10 and supplying said voltages to input terminals of the control voltage generation circuit 20. An output terminal of the control voltage generation circuit 20 is connected to a control terminal (e.g. gate terminal) of the transistor 10. The control voltage generation circuit 20 may generate a control voltage, which is supplied to the control terminal of the transistor 10, on the basis of (i.e. in dependence on, or in accordance with) the detected voltage drop across the transistor 10.

The sensing circuit 30 senses (detects) a quantity indicative of a current flowing through the transistor 10 and may be arranged on either side of the transistor 10. This detected quantity may be the current flowing through the transistor 10, or a derived quantity derived from the current, such as a voltage proportional to the current. In the example of FIG. 1, the quantity indicative of the current flowing through the transistor 10 is a voltage proportional to said current, which is obtained as a voltage drop across the resistor 52. The detected quantity is supplied to the comparator 40, which compares the detected quantity to a predetermined threshold for the detected quantity, e.g. to a predetermined threshold voltage (reference voltage Vref). However, the detected quantity is not limited to such voltage. A binary signal (e.g. a binary voltage signal) $C_O$ is output by the comparator 40 in accordance with a result of the comparison and supplied to the control voltage generation circuit 20. In the case of the comparator 40 being integrated with the control voltage generation circuit 20, supplying the binary signal $C_O$ to the control voltage generation circuit 20 is not necessary. It is to be understood that the binary voltage signal $C_O$ serves as an example for a multi-level voltage signal, and that the present disclosure is not to be construed as being limited to a binary voltage signal.

In embodiments, the comparator 40 may be a comparator having hysteresis. Accordingly, switches to a first level of the (e.g. binary) signal $C_O$ may be performed once the detected quantity exceeds the predetermined threshold implementing a first predetermined threshold, and switches to the second level of the binary signal $C_O$ may be performed once the detected quantity falls below a second predetermined threshold. The second predetermined threshold may be different from the first predetermined threshold, e.g. may be set lower than the first predetermined threshold.

In the above configuration, the control voltage generation circuit 20 may generate the control voltage further on the basis of (i.e. in dependence on, or in accordance with) the detected quantity indicative of the current flowing through the transistor 10. In consequence, the transistor 10 may be said to be controlled in accordance with the detected quantity.

In particular, the control voltage generation circuit 20 may be configured to control the transistor 10 in such a manner (i.e. to generate the control voltage in such a manner) that a current may pass through the transistor 10 if the voltage drop satisfies a first condition, and that the transistor 10 is switched to the fully conducting state (i.e. driven in the linear region, or ohmic mode; or in the saturation region, or active mode) if the detected quantity satisfies a second condition. The first condition may be a condition on the polarity of the voltage drop, e.g. whether or not the polarity of the detected voltage drop is a given polarity corresponding to a forward direction of the active diode circuit 1. The first condition may further relate to whether the detected voltage drop is above a threshold for the voltage drop, e.g. above a voltage enabling a current to flow across the transistor (i.e. above a threshold voltage of the transistor). The second condition may be a condition on the magnitude of the detected quantity, e.g. whether or not the detected quantity exceeds the predetermined threshold.

If the first condition is satisfied (but the second condition is not satisfied), the control voltage generation circuit 20 may output a voltage (second voltage) that is given by a function of the detected voltage drop, e.g. that is proportional to the voltage drop. Such a second voltage may be generated by feeding the detected voltage drop to an amplifier and using an output of the amplifier as the second voltage.

If the second condition is satisfied (i.e. the detected quantity satisfies the second condition), the control voltage generation circuit 20 may output a voltage (first voltage) that is sufficient for driving the transistor 10 in the fully conducting state as the control voltage regardless of the voltage drop (e.g. regardless of whether the first condition is satisfied). Accordingly, once the detected quantity satisfies the second condition (e.g. exceeds the predetermined threshold), the transistor 10 is switched fully on, regardless of the voltage drop across the transistor 10. Thus, by appropriate choice of the second condition (e.g. by appropriate choice of the predetermined threshold) it can be ensured that the transistor 10 is switched fully on for sufficiently small voltage drops, thus improving power efficiency of the active diode circuit 1. Moreover, since the switching of the transistor 10 to the fully conducting state is performed by current control (i.e. in accordance with the detected quantity indicative of the current flowing thought the transistor 10) regardless of the voltage drop, oscillations of the active diode circuit 1 are avoided. Lastly, by appropriate choice of the second condition (e.g. by appropriate choice of the predetermined threshold) and optionally the gain of an amplifier comprised by the control voltage generation circuit 20, characteristics of the active diode circuit 1 can be matched to specific requirements, e.g. can be adapted to match the characteristics of a passive diode, however without featuring a threshold voltage in the forward direction.

Figure 2:
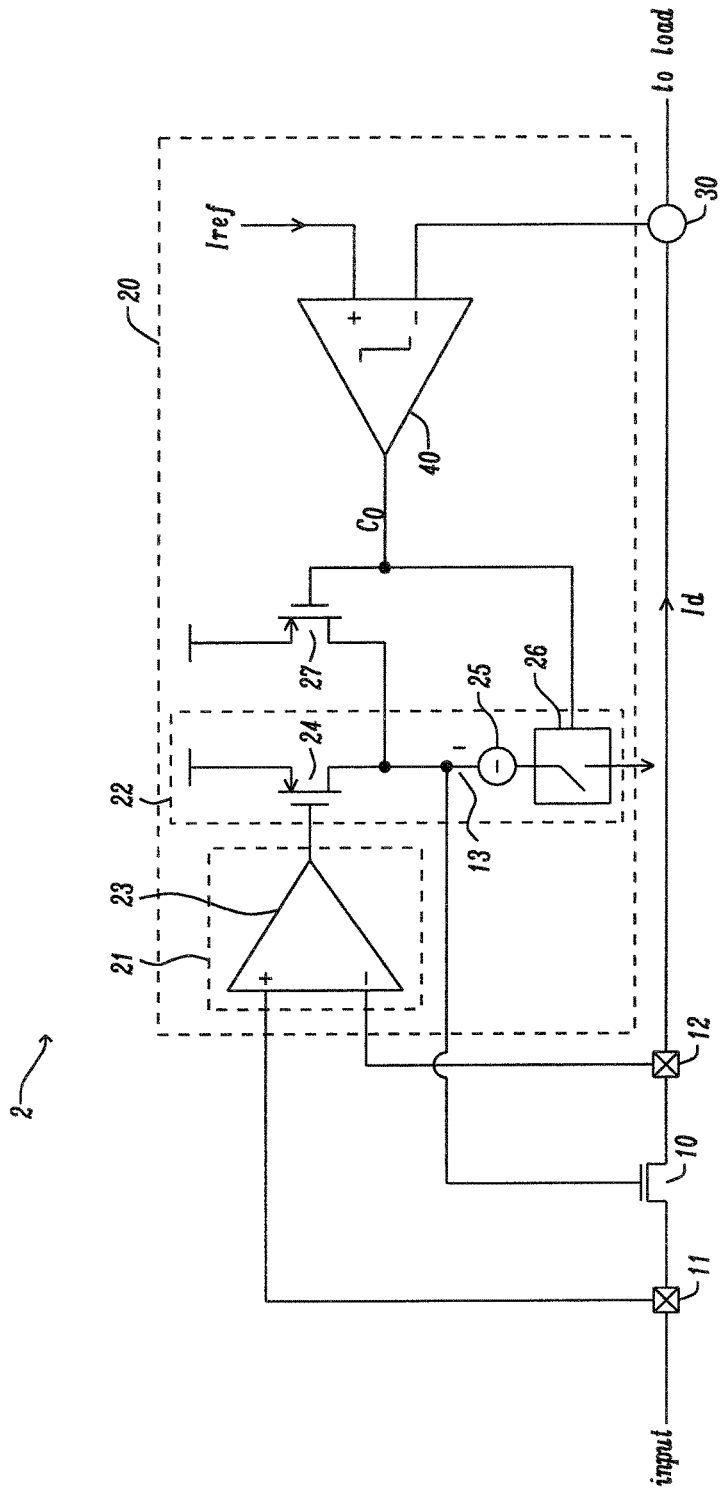

An example for an implementation of the control voltage generation circuit 20 is shown in FIG. 2, which schematically illustrates another example of an active diode circuit 2 according to embodiments of the disclosure. Unless indicated otherwise, elements of the active diode circuit 2 of FIG. 2 are identical to like-numbered elements in active diode circuit 1 of FIG. 1, and will not be described again.

The control voltage generation circuit 20 comprises a first stage amplifier 21 and a second stage amplifier 22. The control voltage generation circuit 20 may further comprise a (first) controllable switching element 27. As indicated above, the comparator 40 may be integrated with the control voltage generation circuit 20 or may be provided separate from the control voltage generation circuit 20.

The comparator 40 compares the detected quantity indicative of the current flowing through the transistor 10 to the predetermined threshold and generates the (e.g. binary) signal $C_O$ in accordance with the result of the comparison. In the example of FIG. 2, the detected quantity that is supplied to the comparator 40 is the current flowing through the transistor 10, and the predetermined threshold is a predetermined current threshold (reference current Iref). However, the detected quantity is not limited to the current, as indicated above. Further in the example of FIG. 2, the binary signal $C_O$ output by the comparator 40 goes to zero if the detected quantity exceeds the predetermined threshold. However, depending on the overall configuration of the control voltage generation circuit 20, the binary signal $C_O$ may also go to the high level at this point, as the skilled person will appreciate. Here, the high level and the zero level are to be understood to serve as examples for two distinct levels of a multi-level signal, and the present disclosure is not to be construed as being limited to these exemplary levels, or to a binary signal.

The first controllable switching element 27 may be a transistor, e.g. a MOSFET, such as a PMOS or an NMOS, for example, and may be connected between a supply voltage and an output terminal of the control voltage generation circuit 20 (i.e. between the supply voltage and the control terminal of the transistor 10). The first controllable switching element 27 may be switched under control of the binary signal $C_0$, which, for the case of the first controllable switching element 27 being a transistor, is supplied to a control terminal of said transistor. In the example of FIG. 2, the first controllable switching element 27 is a PMOS, and goes to the conducting state once the binary signal $C_0$ goes to zero. In general, the first controllable switching element 27 is switched to the conducting state if the detected quantity satisfies the second condition, e.g. exceeds the predetermined threshold.

The first amplifier stage 21 may comprise (e.g. consist of) an amplifier 23. The voltages detected at the nodes 11, 12 on either side of the transistor 10 may be supplied to the positive and negative input terminals of the amplifier 23 in accordance with a desired forward direction of the active diode circuit 2. In the example of FIG. 2, the forward direction of the active diode circuit 2 is from left to right, so that the voltage tapped at node 11 is supplied to the positive input terminal of the amplifier 23, and the voltage tapped at node 12 is supplied to the negative input terminal of the amplifier 23. The amplifier 23 may output a voltage depending on the voltage drop across the transistor 10 (e.g. a voltage that is given by a function, such as a linear function, of the voltage drop across the transistor 10).

The second amplifier stage 22 may comprise a transistor (second transistor) 24, which may be a MOSFET, e.g. a PMOS or an NMOS, for example, and which may be connected between the supply voltage and the output terminal of the control voltage generation circuit 20 (i.e. connected between the supply voltage and the control terminal of the transistor 10). The voltage output of the amplifier 23 may be supplied to a control terminal of the second transistor 24. Accordingly, the second transistor 24 may be switched in dependence on the voltage drop across the transistor 10.

The second amplifier stage 22 may further comprise a current sink 25 and a second controllable switching element 26 connected in series between the second transistor 24 and a predetermined voltage level, e.g. ground (i.e. connected between an intermediate node 13 between the second transistor 24 and the control terminal of the transistor 10, and the predetermined voltage level). The second controllable switching element 26 may be switched in accordance with the binary signal $C_0$, in antiphase to the first controllable switching element 27. That is, in the example of FIG. 2, the second controllable switching element 26 may be switched to the non-conducting state for the binary signal $C_0$ going to zero. In general, the second controllable switching element 26 may be switched to the conducting state if the first controllable switching element 27 is switched to the non-conducting state, and vice versa. This may be achieved e.g. by the first controllable switching element 27 being of normal-open type and the second controllable switching element 26 being of normal-close type, or vice versa, or by inserting an inverter into the signal path between either one of the first and second controllable switching elements 27, 26 and the comparator 40.

The current sink 25 and second controllable switching element 26 connected in series may be seen as an implementation of a switchable current source (switchable current sink) that is switched in accordance with the binary signal $C_0$, in antiphase to the first controllable switching element 27.

Configured as above, driving of the transistor 10 proceeds as follows. Initially, the first controllable switching element 27 is in the non-conducting state, and the second controllable switching element 26 is in the conducting state. The first transistor 10 is switched in accordance with the detected voltage drop across the transistor 10 if the detected voltage drop satisfies the first condition, e.g. has the given polarity (i.e. if the polarity corresponds to the desired forward direction of the active diode circuit 2). This is achieved by the amplifier 23 outputting a voltage that switches the second transistor 24 to the conducting state, so that a current may flow between the supply potential and ground, and a voltage (second voltage) depending on the output voltage of the amplifier, and thus depending on the voltage drop (i.e. being given by a function of the voltage drop), is supplied to the control terminal of the transistor 10. In this state, a current may flow through the transistor 10 in the forward direction.

For increasing current flowing through the transistor 10, if the detected quantity indicative of the current flowing through the transistor 10 satisfies the second condition, e.g. if the detected quantity exceeds the predetermined threshold, the first controllable switching element 27 is switched to the conducting state and the second controllable switching element 26 is switched to the non-conducting state. This is achieved by a switch of levels of the binary signal $C_0$ that controls the first and second controllable switching elements 27, 26, e.g. by the control signal $C_0$ going to zero in the example of FIG. 2. Then, the supply voltage (as an example of the first voltage) is output as the control voltage for driving the transistor 10. Assuming that the supply voltage is sufficient to drive the transistor 10 in the fully conducting state, the transistor 10 is fully switched on at this point.

In an alternative implementation, the series connection of the current sink 25 and the second controllable switching element 26, as well as the second transistor 24 may be omitted, and the second controllable switching element 26 may instead be provided between an output terminal of the amplifier 26 and an intermediate node between the first controllable switching element 27 and the output terminal of the control voltage generation circuit 20 (i.e. an intermediate node between the first controllable switching element 27 and the control terminal of the transistor 10). Also here, the second controllable switching element 26 may be switched in accordance with the binary signal $C_0$, in antiphase to the first controllable switching element 27.

Figure 3:
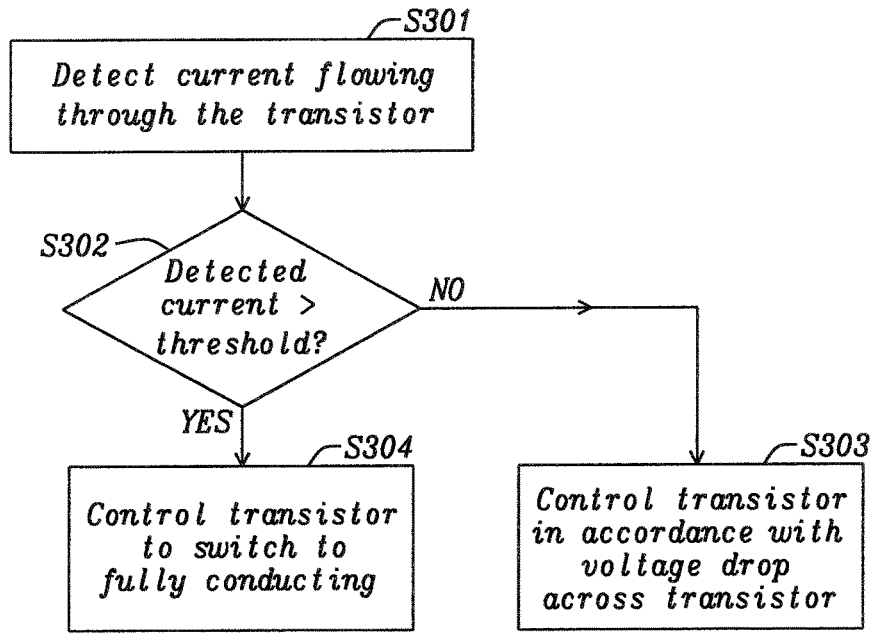

FIG. 3 schematically illustrates a flow chart of an example of a method for controlling a transistor to function as an active diode according to embodiments of the disclosure. At step S301, the quantity indicative of the current flowing through the transistor is detected. At step S302, it is determined whether the detected quantity satisfies the second condition, e.g. whether the detected quantity exceeds the predetermined threshold. If the detected quantity satisfies the second condition (YES at step S302), the transistor is controlled to switch to the fully conducting state at step S304. Otherwise (NO at step S302), the transistor is controlled in accordance with the voltage drop according to the transistor at step S303.

Figure 4:
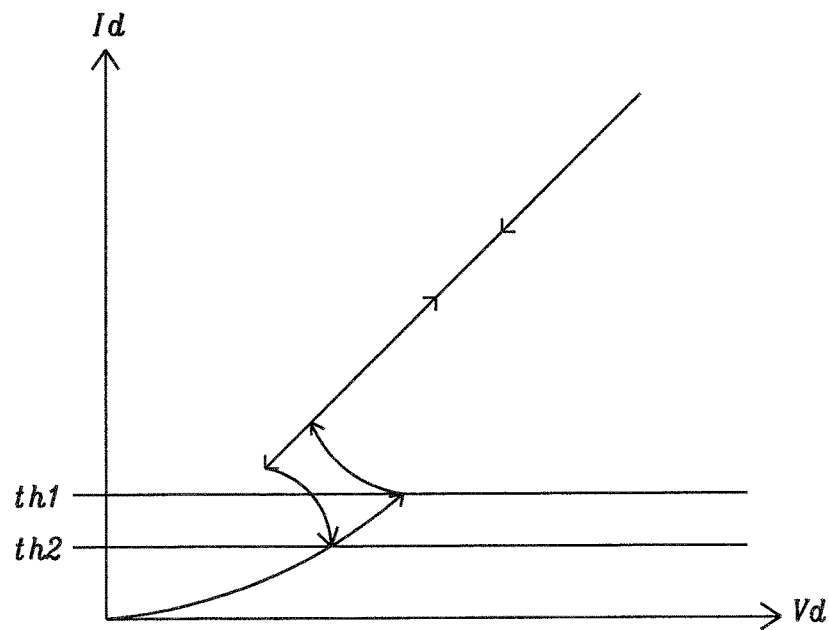
Figure 5:
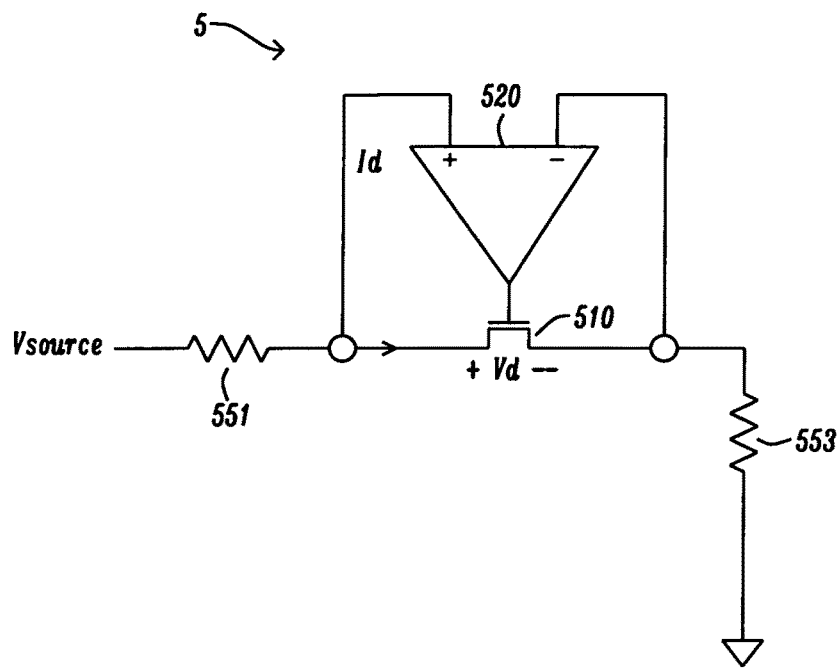
FIG. 5 illustrates an active diode according to the prior art.

FIG. 4 schematically illustrates current-voltage characteristics of an active diode circuit according to embodiments of the disclosure. For the voltage drop Vd in the forward direction of the active diode circuit rising from zero, the current Id flowing though the transistor rises until the current Id exceeds a first threshold th1 (e.g. the above predetermined threshold), and the transistor is switched to fully conducting. At this point, the voltage drop Vd decreases, due to decreased forward resistance of the transistor. However, since the transistor is driven under current control at this point, this decrease of the voltage drop Vd does not result in an oscillation of the active diode circuit. For decreasing current Id, starting from high currents, control of the transistor may be returned to voltage control for the current Id dropping below a second threshold th2, which may be equal to the first threshold, but which may also be different from the first threshold th1, e.g. set below the first threshold th1.

The active diode circuits described above may be employed e.g. in charging systems of mobile devices in which diode assemblies prevent a current from flowing from a battery or a load into the charging circuit, or from the load into the battery. Employing the active diode circuits described above instead of passive diodes for such diode assemblies enables to significantly reduce power losses in the diode assembly since the non-negligible threshold voltages of passive diodes in the forward direction can be avoided.

It should be noted that the apparatus features described above correspond to respective method features that may however not be explicitly described, for reasons of conciseness, and vice versa. The disclosure of the present document is considered to extend also to such method features and apparatus features, respectively.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed apparatus. Furthermore, all statements herein providing principles, aspects, and embodiments of the invention, as well as specific examples thereof, are intended to encompass equivalents thereof.

Figure 6:
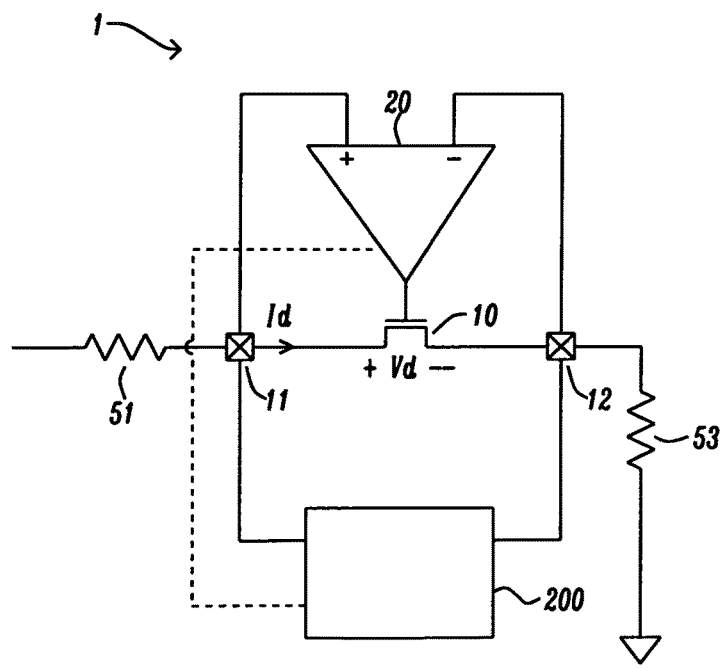
FIG. 6 shows an oscillation sensing circuit.
Figure 7:
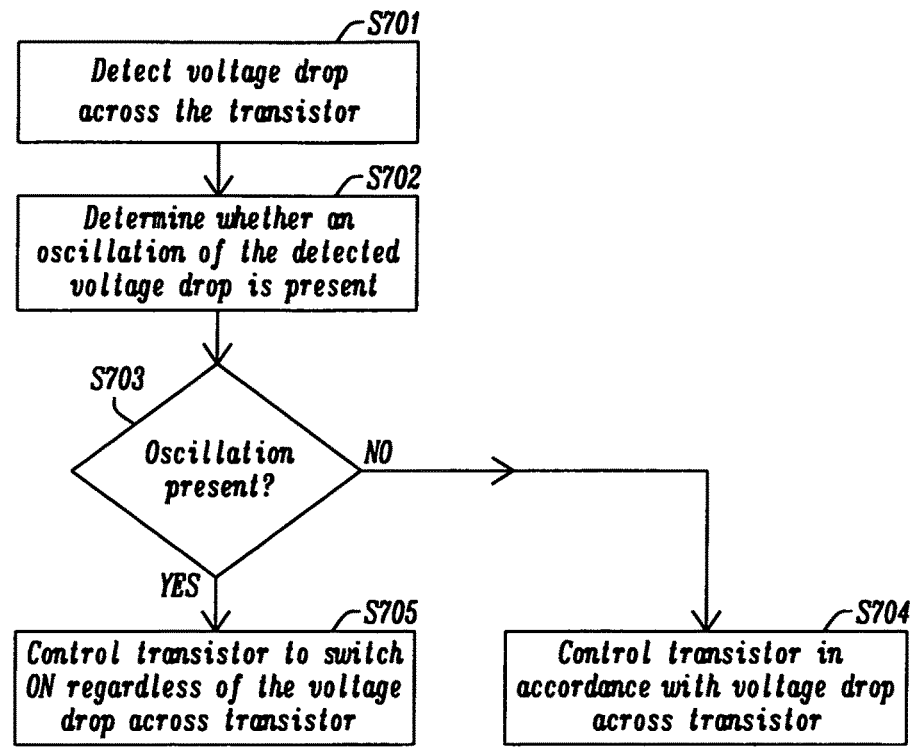
FIG. 7 is a flowchart of voltage and oscillation detection.
Figure 8:
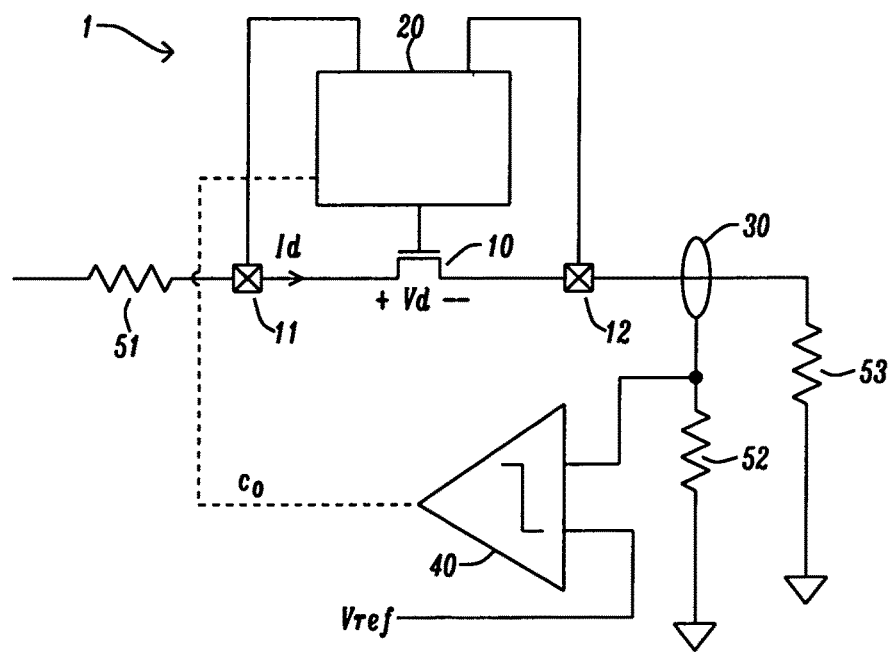
FIG. 8 shows a control voltage generation circuit.

FIG. 6 shows an oscillation sensing circuit 200. FIG. 7 shows steps of detecting a voltage drop across the transistor and determining whether an oscillation of the detected voltage drop is present. FIG. 8 shows a control voltage generation circuit 20 that is configured to detect oscillations in a voltage drop across the transistor, and on detection of an oscillation, output, as the control voltage, a first voltage that is sufficient to drive the transistor in the fully conducting state. This is also shown in step S705 of FIG. 7.

What is claimed is:

1. An active diode circuit for letting current pass in one direction and substantially blocking current in the opposite direction, the active diode circuit comprising:
   a transistor;
   a control voltage generation circuit for generating a control voltage that is supplied to a control terminal of the transistor; and
   a sensing circuit for detecting a quantity indicative of a current flowing through the transistor,
   wherein the control voltage generation circuit is configured to generate the control voltage in dependence on the detected quantity; and
   wherein the control voltage generation circuit is further configured to:
   compare the detected quantity to a predetermined threshold; and
   if the detected quantity exceeds the predetermined threshold, output, as the control voltage, a first voltage that is sufficient to drive the transistor in the fully conducting state.

2. The active diode circuit according to claim 1,
   wherein the control voltage generation circuit is configured to generate the control voltage further in accordance with a detected voltage drop across the transistor; and
   the control voltage is generated in such a manner that the current may pass through the transistor if the voltage drop satisfies a first condition, and the transistor is driven in the fully conducting state if the detected quantity satisfies a second condition.

3. The active diode circuit according to claim 1, wherein the control voltage generation circuit is further configured to:
   if the detected quantity does not exceed the predetermined threshold, output, as the control voltage, a second voltage that is given by a function of the voltage drop.

4. The active diode circuit according to claim 1, wherein the control voltage generation circuit comprises:
   a comparator configured to output a voltage signal in accordance with a result of the comparison of the detected quantity to the predetermined threshold; and
   a controllable switching element configured to switch in accordance with the voltage signal and being connected between a supply voltage and an output terminal of the control voltage generation circuit.

5. The active diode circuit according to claim 4, wherein the control voltage generation circuit further comprises:
   an amplifier configured to amplify the detected voltage drop; and
   a second controllable switching element connected between an output terminal of the amplifier and an intermediate node between the controllable switching element and the output terminal of the control voltage generation circuit,
   wherein the second controllable switching element is configured to switch in accordance with the voltage signal in antiphase to the controllable switching element.

6. The active diode circuit according to claim 4, wherein the control voltage generation circuit further comprises:
   a second transistor connected between the supply voltage and the output terminal of the control voltage generation circuit; and
   an amplifier configured to amplify the detected voltage drop,
   wherein an output of the amplifier is supplied to a control terminal of the second transistor.

7. The active diode circuit according to claim 6, wherein the control voltage generation circuit further comprises a switchable current sink connected between the output terminal of the control voltage generation circuit and ground; and
   the switchable current sink is configured to switch in accordance with the voltage signal in antiphase to the controllable switching element.

8. The active diode circuit according to claim 1, wherein the control voltage generation circuit is further configured to:
   detect oscillations in a voltage drop across the transistor; and
   on detection of an oscillation, output, as the control voltage, a first voltage that is sufficient to drive the transistor in the fully conducting state.

9. The active diode circuit according to claim 8, wherein the control voltage generation circuit is further configured to:

compare the detected quantity to a lower threshold; and
if the detected quantity does not exceed the lower threshold, output a value of the control voltage so as to switch the transistor to the non-conducting state.

10. An active diode circuit for letting current pass in one direction and substantially blocking current in the opposite direction, the active diode circuit comprising:
a transistor;
a control voltage generation circuit for generating a control voltage that is supplied to a control terminal of the transistor;
a voltage sensing circuit for detecting a voltage drop across the transistor; and
an oscillation sensing circuit for detecting an oscillation of the detected voltage drop,
wherein the control voltage generation circuit is configured to generate the control voltage in dependence on the detected voltage drop and a detection result of the oscillation sensing circuit.

11. The active diode circuit according to claim 10, wherein the control voltage is generated in such a manner that the current may pass through the transistor if the voltage drop satisfies a first condition, and the transistor is driven in the fully conducting state if oscillation of the voltage drop is detected.

12. The active diode circuit according to claim 11, further comprising a current sensing circuit for detecting a quantity indicative of a current flowing through the transistor,
wherein the control voltage generation circuit is further configured to:
compare the detected quantity to a predetermined threshold; and
if the detected quantity is below the predetermined threshold and the transistor is driven in the fully conducting state, stop driving the transistor in the fully conducting state.

13. A method of controlling a transistor to function as an active diode so that current may pass in one direction and is substantially blocked in the opposite direction, the method comprising:
detecting a voltage drop across the transistor;
detecting a quantity indicative of a current flowing through the transistor; and
generating a control voltage that is supplied to a control terminal of the transistor in dependence on the voltage drop and the detected quantity,
wherein the control voltage is generated in such a manner that the current may pass through the transistor if the voltage drop satisfies a first condition, and the transistor is driven in a fully conducting state if the detected quantity satisfies a second condition; and
wherein generating the control voltage involves:
comparing the detected quantity to a predetermined threshold, and
if the detected quantity exceeds the predetermined threshold, outputting, as the control voltage, a first voltage that is sufficient to drive the transistor in the fully conducting state.

14. The method according to claim 13, wherein generating the control voltage further comprises the step of:
if the detected quantity does not exceed the predetermined threshold, outputting, as the control voltage, a second voltage that is given by a function of the voltage drop.

15. The method according to claim 13, further comprising:
generating a voltage signal in accordance with a result of the comparison; and
switching a controllable switching element connected between a supply voltage and the control terminal of the transistor in accordance with the voltage signal.

16. The method according to claim 15, further comprising:
amplifying the detected voltage drop by means of an amplifier;
switching a second controllable switching element connected between an output terminal of the amplifier and an intermediate node between the controllable switching element and the control terminal of the transistor in accordance with the voltage signal in antiphase to the controllable switching element.

17. The method according to claim 15, further comprising:
amplifying the detected voltage drop;
applying the amplified voltage drop to a control terminal of a second transistor connected between the supply voltage and the control terminal of the transistor.

18. The method according to claim 17, further comprising:
switching a switchable current sink in accordance with the voltage signal in antiphase to the controllable switching element, the switchable current sink being connected between the second transistor and ground.

19. The method according to claim 13, wherein generating the control voltage involves:
detecting oscillations in the voltage drop across the transistor; and
on detection of an oscillation, outputting, as the control voltage, a first voltage that is sufficient to drive the transistor in the fully conducting state.

20. The method according to claim 19, wherein generating the control voltage further involves:
comparing the detected quantity to a lower threshold; and
if the detected quantity does not exceed the lower threshold, outputting a value of the control voltage so as to switch the transistor to the non-conducting state.

21. A method of controlling a transistor to function as an active diode so that current may pass in one direction and is substantially blocked in the opposite direction, the method comprising:
detecting a voltage drop across the transistor;
determining whether an oscillation of the detected voltage drop is present; and
generating a control voltage that is supplied to a control terminal of the transistor in dependence on the voltage drop and a result of said determination,
wherein the control voltage is generated in such a manner that the current may pass through the transistor if the voltage drop satisfies a first condition, and the transistor is driven in the fully conducting state if it is determined that oscillation of the voltage drop is present.

22. The method according to claim 21, further comprising:
detecting a quantity indicative of a current flowing through the transistor,
wherein generating the control voltage involves:
comparing the detected quantity to a predetermined threshold; and
if the detected quantity is below the predetermined threshold and the transistor is driven in the fully conducting state, stopping driving the transistor in the fully conducting state.

* * * * *